July 19, 1966

M. KAHN 3,262,061

DIRECT COUPLED TRANSISTOR AMPLIFIER
INCLUDING NEGATIVE FEEDBACK

Filed Jan. 28, 1963

INVENTOR.
MANFRED KAHN
BY
Connolly and Hutz
HIS ATTORNEYS

United States Patent Office 3,262,061

Patented July 19, 1966

3,262,061
DIRECT COUPLED TRANSISTOR AMPLIFIER INCLUDING NEGATIVE FEEDBACK

Manfred Kahn, Williamstown, Mass., assignor to Sprague Electric Company, North Adams, Mass., a corporation of Massachusetts Filed Jan. 28, 1963, Ser. No. 254,173
5 Claims. (Cl. 330—17)

This invention relates to transistor amplifiers and in particular to a direct coupled wide band transistor amplifier.

In transistor amplifiers, it is valuable to provide a regative feedback without getting excessive phase shift, which in turn would lead to unstable operation. Moreover, good frequency response is important in amplifiers. Further, having the amplifier gain independent of power supply voltage within a wide range of voltages increases its usefulness.

It is an object of the present invention to provide a wide band direct coupled amplifier.

Another object of this invention is to provide an improved transistorized amplifier of the negative feedback type.

Still another object of this invention is to provide an improved transistor-type negative feedback amplifier capable of stable gain, high input impedance and low output impedance.

These and other objects of this invention will become more apparent upon consideration of the following description when taken in conjunction with the accompanying drawing, wherein.

In general, the objects of this invention are attained in a preferred embodiment that includes an amplifier having four direct coupled transistors with an overall negative feedback loop between the emitters of the first and last transistors. The first transistor has a high load impedance since the second stage is an emitter-follower. The third transistor sees a high load impedance for a similar reason, and the first and third stages therefore provide high voltage gain. The direct coupling permits the overall negative feedback loop to provide optimum stability of operating points and of gain performance, because the lack of reactive elements in the forward loop avoids excessive phase shift which would lead to instability with an overall negative feedback loop.

Figure 1:
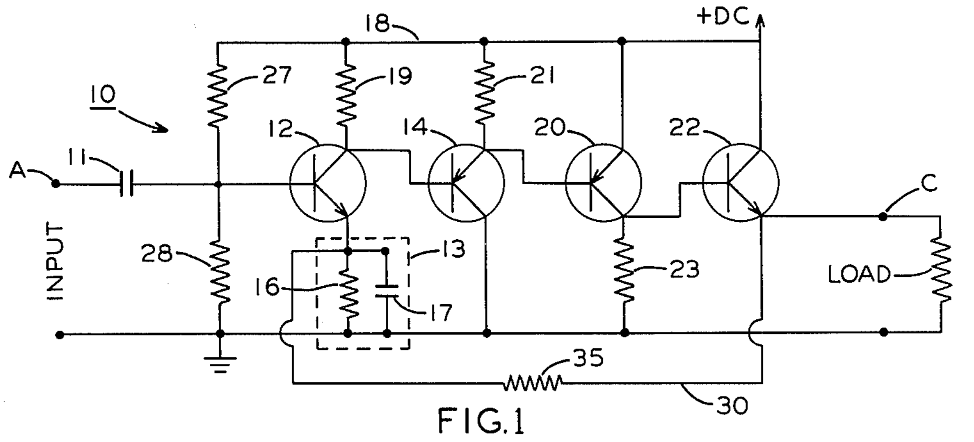
FIGURE 1 is a schematic diagram of the fundamental amplifier of the invention utilizing a D.C. feedback loop for operating point stabilization.

FIGURE 1 shows the fundamental amplifier of this invention as comprising four direct coupled transistors 12, 14, 20 and 22 with a negative feedback loop 30 between the emitters of transistors 12 and 22. The amplifier utilizes a circuit 10 of the negative feedback type having an input capacitor 11 through which the signal is received and including a first NPN transistor 12.

This transistor 12 is made to operate as a grounded-emitter transistor by a connection feeding the signal into its base, and by a connection of its emitter to ground through an emitter network 13, and by a connection of its collector directly into the base of a second transistor 14 which is an emitter-follower transistor. The emitter network 13 of the first transistor 12 consists of an emitter resistor 16 and a capacitor 17. A line 18 carries a suitable D.C. supply voltage and a resistor 19 is the collector load for the first stage.

The second transistor 14 is made to operate in the common collector mode by a connection of its collector to ground. The signal is taken from the emitter of this PNP transistor 14 and directly coupled into the base of a third transistor 20. Resistor 21 is the emitter resistor for the second stage.

The third transistor 20 is a PNP type operated in the common emitter mode by a connection of its emitter directly to the line 18, and by taking the signal from the collector by coupling the collector to the base of a fourth NPN transistor 22. The resistor 23 is the collector load for the transistor 20.

The fourth and last transistor 22 is operated in the common collector mode by connecting its emitter to the output terminal C, with its collector connected to line 18. Capacitor 11 is the input coupling capacitor from input terminal A. Resistors 27 and 28 set the D.C. operating points for the amplifier.

The negative feedback loop 30 is provided with a feedback resistor 35. The negative feedback is applied from the output to the input of the amplifier so as to provide maximum gain for a given stability. The negative feedback is arranged so as to reduce the output impedance and increase the input impedance of the amplifier by the same degree by which the amplifier voltage gain is lowered with this negative feedback. The power gain of the amplifier therefore stays the same. Also, this type of feedback as employed allows the amplifier to produce an undistorted output signal, the peak to peak value of which is within 90% of the available power supply voltage.

Figures 2, 3, 4:
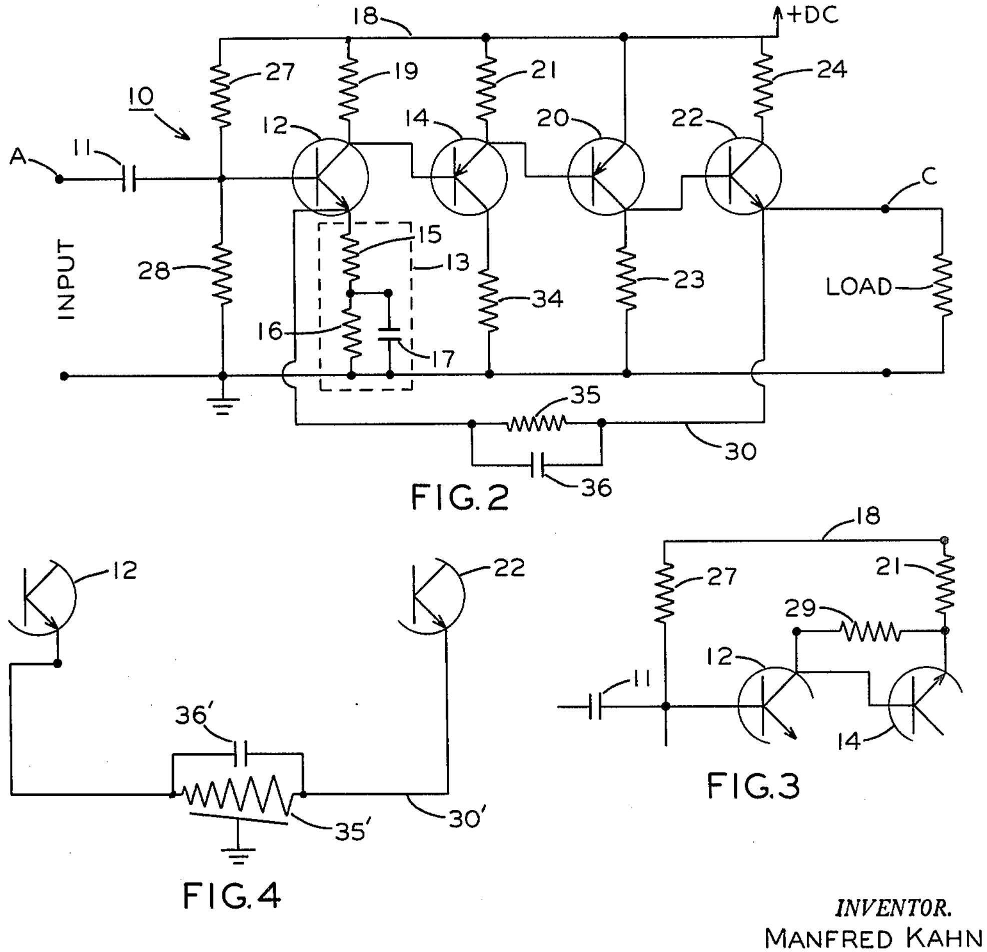
FIGURE 2 is the fundamental amplifier of FIGURE 1 modified for precise bandpass performance.
FIGURE 3 is a modified feedback loop for providing the amplifier of FIGURE 2 with narrow band-pass characteristics.
FIGURE 4 is a modification of the first stage load network for a higher current operating point.

The amplifier shown in FIGURE 2 is a preferred embodiment of the fundamental amplifier of FIGURE 1 with suitable protective impedances added. The emitter network 13 of the amplifier of FIGURE 2 includes a first emitter resistor 15 in addition to resistor 16 and capacitor 17. In addition, final transistor 22 is protected by connecting the collector to line 18 through protecting resistor 24. Resistor 24 protects the transistor 22 in case the output lead C accidentally shorts to ground. Additional protection is provided by resistor 34 which protects transistors 14 and 20 against high transients. Feedback drop 30 of the FIGURE 2 amplifier comprises a feedback resistor 35 and a feedback capacitor 36 which are connected between the terminal C and the emitter of the first transistor 12.

The feedback resistor 35 and resistor 15 determine the midband gain of the amplifier circuit 10. The high frequency cut-off is determined by the capacitor 36, and the low frequency cut-off is determined by capacitor 17. On the other hand, the D.C. gain of the amplifier is determined by the ratio between resistor 35 and the sum of resistors 15 and 16.

The following table lists one typical set of values for the components of the circuit shown in FIGURE 2 when it is desired to operate the amplifier 10 with a gain of 40 db over a frequency range of from 100 c.p.s. to 100 kc.:

| | |
|---|---|
| Resistor **35** | 10K ohms. |
| Capacitor **36** | 50 mmf. |
| Capacitor **11** | .033 mf. |
| Resistor **27** | 270K ohms. |
| Resistor **28** | 150K ohms. |
| Resistor **23** | 100K ohms. |
| Resistor **16** | 10K ohms. |
| Capacitor **17** | 40 mf. |
| Resistor **19** | 1M ohms. |
| Resistor **21** | 2K ohms. |
| Resistor **24** | 200 ohms. |
| Resistor **34** | 200 ohms. |

FIGURE 3 shows a modification of the amplifier of this invention wherein a load resistor 29 of the first stage is connected to the emitter of the second stage. This results in positive feedback around the second transistor 14. The feedback is non-regenerative, because transistor 14 has a voltage gain of less than one, whereas a loop gain of greater than one is required for regeneration. Nevertheless, this positive feedback increases the A.C. impedance that resistor 29 presents to the collector of transistor 12 by a factor that is approximately the current gain (Beta) of transistor 14. This allows the utilization of a much lower resistor (and higher D.C. current) in the collector of transistor 12 without loosing circuit gain, as would be the case if resistor 29 were connected to line 18, whereby its A.C. impedance would approximately its D.C. resistance.

The higher current operating point advantage of the modification of FIGURE 3 is demonstrated by comparison with FIGURE 2 wherein collector load resistor 19 is connected to line 18 and has a value of one megohm. Inasmuch as the voltage between the collector of transistor 12 and line 18 is the sum of the emitter to base voltages of transistors 12 and 14 (about 1.4 volts for silicon transistors), the current in the collector of transistor 12 of FIGURE 2 is only about 2 to 3 microamps. In contrast, a 10K ohm resistor 29 in FIGURE 3 provides about the same impedance at the collector of transistor 12 (for a Beta of 100 in transistor 14), but the current in transistor 12 has now been increased to about 70 microamps. For normal transistors, the gain increases linearly with collector current in this range; therefore, the gain of the first stage of the amplifier and the open loop gain of the amplifier have been increased by as much as 25 db.

The utility of the amplifier of this invention resides in the amplifier gain which is independent of the power supply voltage within a wide voltage range. Below 60 db of closed loop gain, the amplifier gain and the frequency response are largely dependent on the components in the negative feedback loop. The lack of reactive elements in the forward loop and direct coupling of the stages avoids instability when the negative feedback loop is closed. This is because he circuit eliminates the possibility of excessive phase shift which in turn prevents positive feedback to any great extent that might result at some frequencies. The positive feedback in turn might cause unstable operation. The overall negative feedback from the output terminal to the emitter of the first transistor increases the input impedance while lowering the output impedance. Thus, a very significant stabilization of the amplifier gain is achieved. Other advantages include the low temperature coefficient of the gain as well as the good output linearity and the high amplitude of the output voltage.

From the foregoing it appears that a wide band amplifier with direct coupled stages is provided in four transistors. The amplifier has a high input impedance, a low output impedance, large available output power, and the amplifier gain is independent of power supply voltage within wide limits. The amplifier of this invention has a high available power output due to its low output impedance. This is because the last transistor is operated as a low output impedance emitter-follower that has its output impedance reduced further by the negative feedback loop. This simple network is as effective as a more complex network having a greater number of components.

The basic circuit described and illustrated in the abovenoted preferred embodiment of FIGURE 2 can also be used as a narrow band amplifier by using a frequency selective network in the feedback loop. FIGURE 4 illustrates a negative feedback loop 30′ which utilizes a notch network having a lumped capacitor 36′ and a tapered resistor 35′ with distributed capacitance to ground.

The amplifier of this invention has been described and illustrated by circuits having the transistors of the first and fourth stages of opposite polarity from the transistors of the second and third stages. However, it is to be understood that the principle of this invention can be implemented by circuits having transistors of the same polarity in all four stages.

It will be understood that the above-described embodiments are merely illustrative of the principles of the invention and that modifications may be made without departing from the spirit and scope of the invention. Therefore, it is intended that this invention be limited only by the scope of the following claims.

What is claimed is:

1. An amplifier circuit comprising four direct coupled transistors, the first transistor and the third transistor of said transistors being in common emitter configuration, the second transistor and the fourth transistor of said transistors being in common collector configuration, said transistors being of complementary polarity with said third transistor being of opposite polarity from said fourth transistor, and an overall negative feedback loop from the emitter of said fourth transistor to the emitter of said first transistor.

2. An amplifier as described in claim 1 wherein the second transistor is of opposite polarity from the first transistor, and a resistor is connected between the collector of the first transistor and emitter of the second transistor.

3. An amplifier as described in claim 1 wherein a low frequency cut-off control means comprises a shunt capacitor in the emitter circuit of the first transistor arranged to be acted upon by the overall negative feedback loop.

4. An amplifier as described in claim 1 wherein a high frequency cut-off control means comprises a capacitor in a series arm of the overall negative feedback loop.

5. An amplifier as described in claim 1 wherein the overall negative feedback includes a distributed notch network, thereby conveying narrow band-pass characteristics to the amplifier.

References Cited by the Examiner

UNITED STATES PATENTS

| | | | |
|---|---|---|---|
| 2,996,683 | 8/1961 | Lefkowitz | 330—21 |
| 3,107,331 | 10/1963 | Barditch et al. | |
| 3,116,460 | 12/1963 | Nowlin | 330—109 X |
| 3,140,448 | 7/1964 | Murray | 330—19 |
| 3,148,334 | 9/1964 | Kaufman. | |

FOREIGN PATENTS

| | | |
|---|---|---|
| 627,487 | 9/1961 | Canada. |

OTHER REFERENCES

Hager: Network Design of Microcircuits, Electronics, col. 32, No. 36, pages 44–49.

Roehr: Application Notes, Motorola Semiconductor Products Inc., August 1960, AM 119, 4 pages.

ROY LAKE, *Primary Examiner.*

NATHAN KAUFMAN, *Examiner.*

F. D. PARIS, *Assistant Examiner.*